United States Patent
Richard

(10) Patent No.: US 10,859,366 B2
(45) Date of Patent: Dec. 8, 2020

(54) METHOD AND INSTRUMENT FOR MEASURING ETCH DEPTH BY DIFFERENTIAL POLARIMETRIC INTERFEROMETRY AND GLOW DISCHARGE SPECTROMETRY APPARATUS COMPRISING SUCH A MEASURING INSTRUMENT

(71) Applicant: HORIBA FRANCE SAS, Long Jumeau (FR)

(72) Inventor: Simon Richard, Palaiseau (FR)

(73) Assignee: HORIBA FRANCE SAS, Palaiseau (FR)

( * ) Notice: Subject to any disclaimer, the term of this patent is extended or adjusted under 35 U.S.C. 154(b) by 20 days.

(21) Appl. No.: 16/470,061

(22) PCT Filed: Dec. 14, 2017

(86) PCT No.: PCT/FR2017/053589
§ 371 (c)(1),
(2) Date: Jun. 14, 2019

(87) PCT Pub. No.: WO2018/109410
PCT Pub. Date: Jun. 21, 2018

(65) Prior Publication Data
US 2020/0103214 A1  Apr. 2, 2020

(30) Foreign Application Priority Data
Dec. 16, 2016  (FR) ..................... 16 62644

(51) Int. Cl.
G01B 9/02        (2006.01)
G01B 11/22       (2006.01)
(Continued)

(52) U.S. Cl.
CPC ....... *G01B 9/02019* (2013.01); *G01B 9/0203* (2013.01); *G01B 9/02081* (2013.01);
(Continued)

(58) Field of Classification Search
CPC .............. G01B 9/02019; G01B 9/0203; G01B 9/02081; G01B 9/02083; G01B 11/22; G01B 2290/45; G01B 2290/70
See application file for complete search history.

(56) References Cited

U.S. PATENT DOCUMENTS

| 5,898,500 A | 4/1999 | Canteloup et al. |
| 6,075,603 A * | 6/2000 | O'Meara ............ G01D 5/26 356/496 |

(Continued)

FOREIGN PATENT DOCUMENTS

| FR | 2 760 085 | 8/1998 |
| FR | 3 020 684 | 11/2015 |
| WO | WO 2015/166186 | 11/2015 |

OTHER PUBLICATIONS

International Search Report, PCT/FR2017/053589, dated Feb. 15, 2018.

(Continued)

*Primary Examiner* — Michael A Lyons
(74) *Attorney, Agent, or Firm* — Nixon & Vanderhye

(57) ABSTRACT

Disclosed is a method for measuring etch depth including the following steps: splitting a light beam into a first, and respectively second, incident beam directed towards a first, respectively second, area of a sample exposed to an etching treatment to form a first, and respectively second, reflected beam, recombining the first reflected beam and the second reflected beam to form an interferometric beam; detecting a first, and respectively second, interferometric intensity signal relative to a first, respectively second, polarisation component; calculating a lower envelope function and an (Continued)

upper envelope function of a differential polarimetric interferometry signal; determining an offset function and a normalisation function from the first lower envelope function and the first upper envelope function; and calculating a differential polarimetric interferometry function normalised locally at each time instant.

16 Claims, 4 Drawing Sheets

(51) Int. Cl.
*H01L 21/3065* (2006.01)
*H01L 21/66* (2006.01)

(52) U.S. Cl.
CPC .......... *G01B 9/02083* (2013.01); *G01B 11/22* (2013.01); *G01B 2290/45* (2013.01); *G01B 2290/70* (2013.01); *H01L 21/3065* (2013.01); *H01L 22/26* (2013.01)

(56) References Cited

U.S. PATENT DOCUMENTS

| | | | |
|---|---|---|---|
| 6,259,530 B1 | 7/2001 | Monsallut | |
| 10,073,038 B2 | 9/2018 | Richard et al. | |
| 2002/0126292 A1* | 9/2002 | Rushford | G01B 11/065 356/492 |
| 2008/0002212 A1* | 1/2008 | Kawasaki | G01B 9/02028 356/512 |
| 2014/0152996 A1* | 6/2014 | Osawa | G01B 9/02091 356/479 |
| 2017/0045457 A1 | 2/2017 | Richard et al. | |

OTHER PUBLICATIONS

Pascal Amary Et Al: "<title> New sensor for real-time trench depth monitoring in micromachining applications </title>", Proceedings of SPIE, vol. 3874, Aug. 30, 1999 (Aug. 30, 1999), pp. 205-217, XP055128888, ISSN: 0277-786X, 001: 10.1117/12.361223 abstract pp. 206-208.

* cited by examiner

METHOD AND INSTRUMENT FOR MEASURING ETCH DEPTH BY DIFFERENTIAL POLARIMETRIC INTERFEROMETRY AND GLOW DISCHARGE SPECTROMETRY APPARATUS COMPRISING SUCH A MEASURING INSTRUMENT

TECHNICAL FIELD TO WHICH THE INVENTION RELATES

The present invention generally relates to the field of in situ etch depth measurement apparatuses and methods based on optical measurements.

More precisely, the invention relates to in situ etch depth measurement apparatus and method based on a technique of differential polarimetric interferometry.

The invention applies in particular to a system or a method for analysing materials by glow discharge spectrometry, this analysis being resolved as a function the etching depth into the sample.

The invention more particularly applies to an elementary analysis system or method based on a glow discharge (GD) coupled to an instrument of analysis by optical emission spectrometry (GD-OES) or by mass spectrometry (GD-MS). Hence, the invention relates to glow discharge spectrometry (GDS) apparatus and method for measuring in situ the etch depth of a sample exposed to this glow discharge plasma.

TECHNOLOGICAL BACK-GROUND

In the present document, it is meant by etching treatment, exposing a material or a solid sample to a plasma, to an ionic bombardment, to a liquid- or vapour-phase chemical treatment, or to a plasma-assisted vapour-phase chemical treatment. According to the composition of the material to be etched, different ionic precursors, liquid and/or gaseous, may be used to perform this etching.

Thin-film material etching treatments are commonly used in microelectronics or in the manufacturing of photovoltaic cells to form thin-film electronic devices.

Measurement instruments exist, based on the reflectometry to control in situ the etch depth as a function of time during an etching treatment. It is hence known from document FR2760085 A1 a polarimetric camera device. However, it is desirable to improve the accuracy and the reliability of these measurement instruments.

The etching of thin-film materials or layers also serves for analysing the composition of these materials. Hence, glow discharge spectrometry is a measurement technique that allows analysing the elementary and/or molecular chemical composition of homogeneous or multilayer solid samples. The measurement may be performed in the core of a sample or be depth-resolved. Glow discharge spectrometry is commonly used to analyse the composition of an homogeneous sample. Glow discharge spectrometry is also used to analyse the composition profile of solid materials or samples consisted of stacks of thin layers as a function of the etch depth.

The glow discharge spectrometry principle consists in exposing a limited area of a face of a sample to an etching plasma. The plasma tears atoms away from the sample surface and places them in ionized or excited electronic states. The nature of these atoms may be determined by analysis of the emission spectrum of the plasma and the mass spectrum of the ions produced in the plasma. Atoms being torn away from the surface exposed to the plasma, a crater is created in the sample surface as a function of the time of exposure to the plasma. An analysis of the mass spectrometry or optical emission spectrometry signals as a function of the time of erosion hence allows obtaining the composition of the sample resolved as a function of the etching time.

However, the etching speed generally varies during the etching process. The etching speed varies in particular as a function of the composition of the area of the sample that is exposed to the plasma, for example as a function of the composition and/or the structure of different thin layers in a stack, and also as a function of transient phenomena linked to the starting of the plasma.

Now, it is desirable to analyse the composition as a function of the depth of the erosion crater generated by the plasma and not only as a function of time during the erosion plasma.

Different methods exist for measuring the depth of the erosion crater as a function of time.

The most used method today is based on a calibration of the speed of erosion for reference samples of known composition. This calibration requires making different measurements on different reference samples and is based on hypotheses such as, for example, a known and/or homogeneous specific gravity of the layer or material considered. The accuracy of the obtained result remains uncertain.

It is known in particular from document WO 2015/166186 A1 a system for measuring the etch depth combined with a glow discharge spectrometry apparatus. More precisely, the measurement of the etch depth of a first area, exposed to the plasma, takes as a reference of null depth, at each time instant, a second reference area on the sample that is protected from the plasma. That way, the measurement is insensitive to the expansions of the etch chamber.

Nevertheless, errors are observed in the etch depth measurement according to the nature of the exposed layer. These errors may be relatively significant for values corresponding to a low etch depth going from a few hundreds of nanometres to a few micrometres.

OBJECT OF THE INVENTION

In order to remedy the above-mentioned drawback of the state of the art, the present invention proposes a method for measuring etch depth as a function of time by differential polarimetric interferometry, comprising the following steps:

splitting a light beam into a first incident beam and a second incident beam, the first incident beam being directed towards a first area of a sample exposed to an etching treatment to form a first reflected beam and, respectively, the second incident beam being directed towards a second area of the sample to form a second reflected beam, recombining the first reflected beam and the second reflected beam to form an interferometric beam, polarisation splitting the interferometric beam into at least a first polarisation component and a second polarisation component, orthogonal to each other;

detecting, as a function of time (t), over a time interval (t0, t1), a first interferometric intensity signal relating to the first polarisation component and a second interferometric intensity signal relating to the second polarisation component;

calculating a first differential polarimetric interferometry signal as a function of linear combinations of the first interferometric intensity signal and of the second interferometric intensity signal;

calculating a first lower envelope function and a first upper envelope function of the first differential polarimetric interferometric signal over the time interval (t0, t1);

determining a first offset function equal to half a sum of the first lower envelope function and the first upper envelope function at each time instant (t) of the time interval (t0, t1);

determining a first normalisation function equal to half a difference between the first lower envelope function and the first upper envelope function at each time instant (t) of the time interval (t0, t1);

applying the first offset function and the first normalisation function to the first differential polarimetric interferometry signal to form a first locally-normalised differential polarimetric interferometry function at each time instant (t) of the time interval (t0, t1); and extracting an optical phase-shift measurement as a function of time over said time interval (t0, t1), from the first locally-normalised differential polarimetric interferometry function;

calculating the etch depth as a function of time from the optical phase-shift measurement.

This method allows a local (in the time sense) or instantaneous normalisation of the mean and the amplitude of the polarimetric interferometry signal. The extracted phase-shift measurement is hence more exact, more accurate and less noisy.

This method makes it possible to free from the reflexion coefficient variations of the etched surface.

Moreover, this local normalisation at each time instant t is compatible with a real-time estimation, because the offset and amplitude functions can be evaluated at each measurement time instant.

Advantageously, the second area of the sample is a reference area that includes a mask, such as for example a photolithography mask, or that is physically protected against the etching treatment. It is considered that the etching of the second area is negligible with respect to the etching of the first area.

Other non-limitative and advantageous characteristics of the method according to the invention, taken individually or according to all the technically possible combinations, are the following:

the step of polarisation splitting the interferometric beam further generates a third polarisation component and a fourth polarisation component, said third and fourth polarisation components being orthogonal to each other, and the first, second, third and fourth polarisation components being independent of each other, and the method further comprising the following steps:

detecting, as a function of time (t), on the time interval (t0, t1), a third interferometric intensity signal relating to the third polarisation component and a fourth interferometric intensity signal relating to the fourth polarisation component;

calculating a second differential polarimetric interferometry signal as a function of linear combinations of the third interferometric intensity signal and of the fourth interferometric intensity signal;

calculating a second lower envelope function and a second upper envelope function of the second differential polarimetric interferometry signal;

determining a second offset function equal to half a sum of the second lower envelope function and the second upper envelope function at time instant t;

determining a second normalisation function equal to half a difference between the second lower envelope function and the second upper envelope function at time instant t;

applying the second offset function and the second normalisation function to the second differential polarimetric interferometry signal to form a second locally-normalised differential polarimetric interferometry function, and wherein the extraction of the optical phase-shift measurement as a function of time over said time interval (t0, t1) is performed from a ratio between the first locally-normalised differential polarimetric interferometry function and the second locally-normalised differential polarimetric interferometry function.

According to a particular and advantageous aspect, the third polarisation component and the fourth polarisation component are chosen among linear, or respectively circular, polarisation components.

According to a particular and advantageous aspect, the second differential polarimetric interferometry signal is equal to a difference between the third interferometric intensity signal and the fourth interferometric intensity signal divided by a sum of the third interferometric intensity signal and the fourth interferometric intensity signal.

Preferably, the first polarisation component and the second polarisation component are chosen among linear, or respectively circular, polarisation components.

According to a particular and advantageous aspect, the first differential polarimetric interferometry signal is equal to a difference between the first interferometric intensity signal and the second interferometric intensity signal divided by a sum of the first interferometric intensity signal and the second interferometric intensity signal.

In a particular embodiment, the step of calculating a first, and/or respectively second, lower envelope function includes a step of linear or polynomial interpolation and/or the step of calculating a first, and/or respectively second, upper envelope function includes another step of linear or polynomial interpolation.

Particularly advantageously, the method further comprises a step of filtering the first interferometric intensity signal and/or, respectively, the second interferometric intensity signal, before the step of envelope function calculation.

The invention also proposes a differential polarimetric interferometer comprising a light source adapted to generate a light beam, an optical beam splitter adapted to split the light beam into a first incident beam and a second incident beam, the first incident beam being directed towards a first area of a sample exposed to an etching treatment to form a first reflected beam and, respectively, the second incident beam being directed towards a second area of the sample to form a second reflected beam, a beam combiner adapted to recombine the first reflected beam and the second reflected beam to form an interferometric beam, a polarisation splitter adapted to split the interferometric beam into at least a first polarisation component and a second polarisation component, the first polarisation component and the second polarisation component being orthogonal to each other, a first detector adapted to receive the first polarisation component and to generate a first interferometric intensity signal as a function of time (t) over a time interval (t0, t1) and a second detector adapted to receive the second polarisation component and to generate a second interferometric intensity signal as a function of time (t) over a time interval (t0, t1).

According to the invention, the differential polarimetric interferometer includes a calculator adapted to calculate a first differential polarimetric interferometry signal as a function of linear combinations of the first interferometric intensity signal and of the second interferometric intensity signal, to calculate a first lower envelope function and a first upper envelope function of the first differential polarimetric interferometry signal over the time interval (t1, t1), to determine a first offset function equal, at each time instant t, to half a sum of the first lower envelope function and the first upper envelope function, to determine a first normalisation function equal, at each time instant t of the time interval (t0, t1), to half a difference between the first lower envelope function and the first upper envelope function, to apply the first offset function and the first normalisation function to the first differential polarimetric interferometry signal to form a first locally-normalised differential polarimetric interferometry function, and to extract an optical phase-shift measurement as a function of time over said time interval (t0, t1), from the first locally-normalised differential polarimetric interferometry function and to calculate the etch depth as a function of the optical phase-shift.

According to a particular and advantageous embodiment, the differential polarimetric interferometer further comprises another polarisation splitter adapted to split the interferometric beam into a third polarisation component and a fourth polarisation component, the third polarisation component and the fourth polarisation component being orthogonal to each other and being independent of the first polarisation component and of the second polarisation component; a third detector (83) adapted to receive the third polarisation component and to generate a third interferometric intensity signal as a function of time (t) over the time interval (t0, t1) and a fourth detector adapted to receive the fourth polarisation component and to generate a fourth interferometric intensity signal as a function of time (t) over the time interval (t0, t1); and the calculator is adapted to calculate a second differential polarimetric interferometry signal as a function of linear combinations of the third interferometric intensity signal and of the fourth interferometric intensity signal; to calculate a second lower envelope function and a second upper envelope function of the second differential polarimetric interferometry signal over the time interval (t0, t1); to determine a second offset function equal, at each time instant t, to half a sum of the second lower envelope function and the second upper envelope function; to determine a second normalisation function equal, at each time instant t of the time interval (t0, t1), to half a difference between the second lower envelope function and the second upper envelope function; to apply the second offset function and the second normalisation function to the second differential polarimetric interferometry signal to form a second locally-normalised differential polarimetric interferometry function, and to perform the extraction of the optical phase-shift measurement as a function of time over said time interval (t0, t1) from a ratio between the first locally-normalised differential polarimetric interferometry function and the second locally-normalised differential polarimetric interferometry function.

The invention also relates to a glow discharge spectrometry apparatus comprising a differential polarimetric interferometer according to one of the embodiments described.

Finally, the invention also relates to an etching control device comprising a differential polarimetric interferometer according to one of the embodiments described, combined with a visualisation camera adapted to form an image of the first area and of the second area of the sample.

DETAILED DESCRIPTION OF AN EXEMPLARY EMBODIMENT

The following description in relation with the appended drawings, given by way of non-limitative example, will allow a good understanding of what the invention consists of and of how it can be implemented.

In the appended drawings:

FIG. 1 schematically shows a differential polarimetric interferometry system combined to a selective etching apparatus according to an embodiment of the invention;

Figure 4:
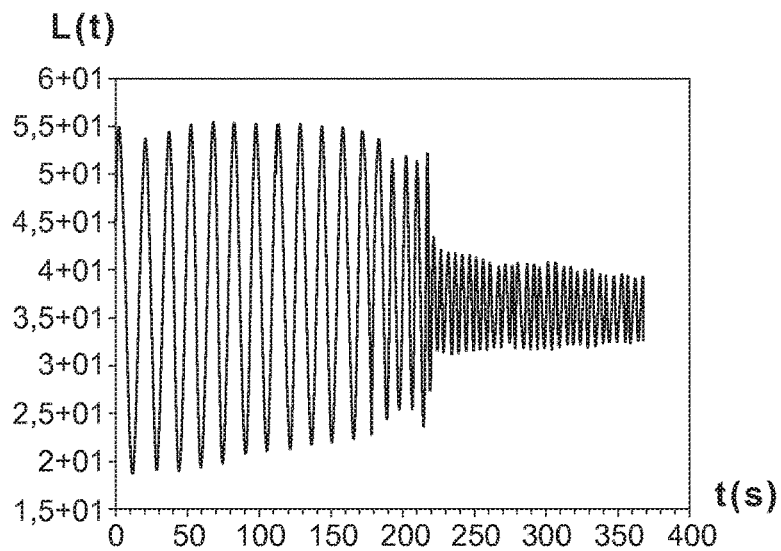
Figure 5:
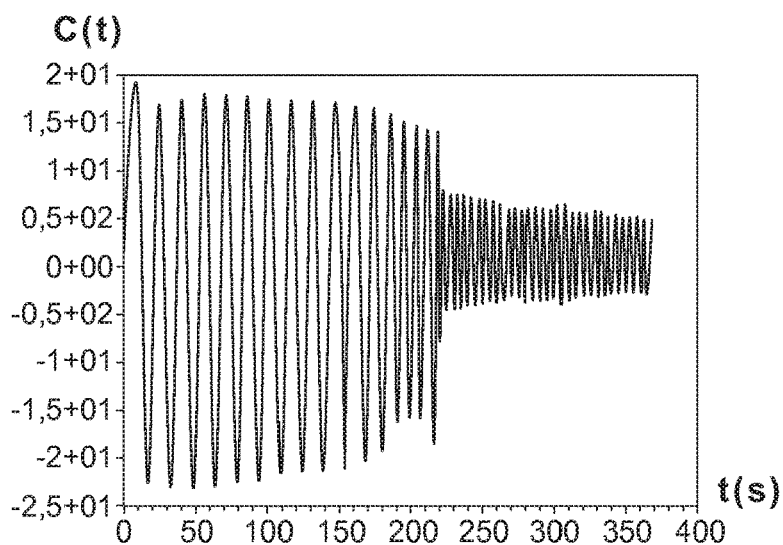
Figure 6:
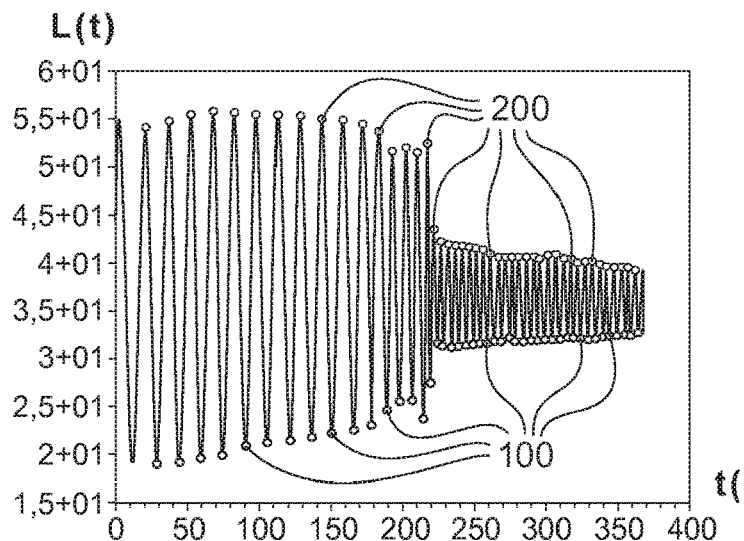
Figure 7:
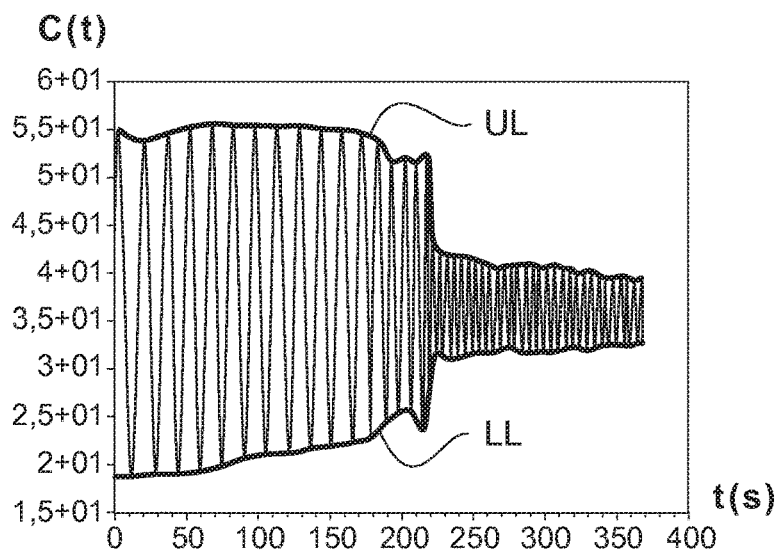
Figure 8:
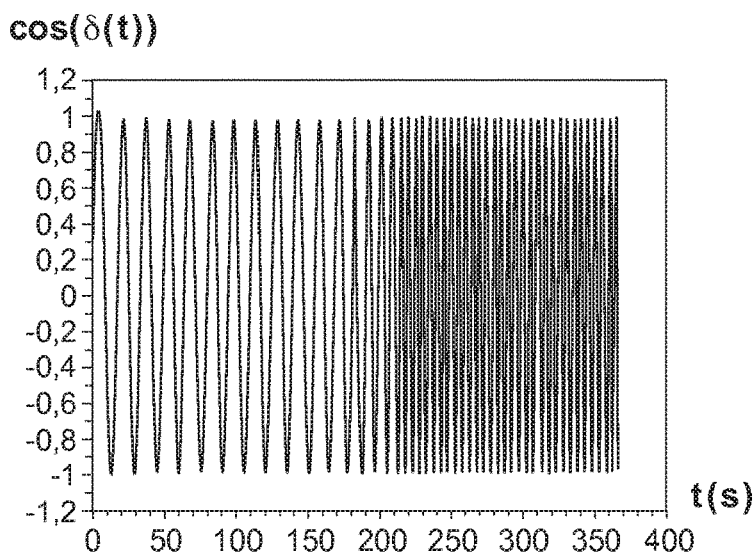
Figure 9:
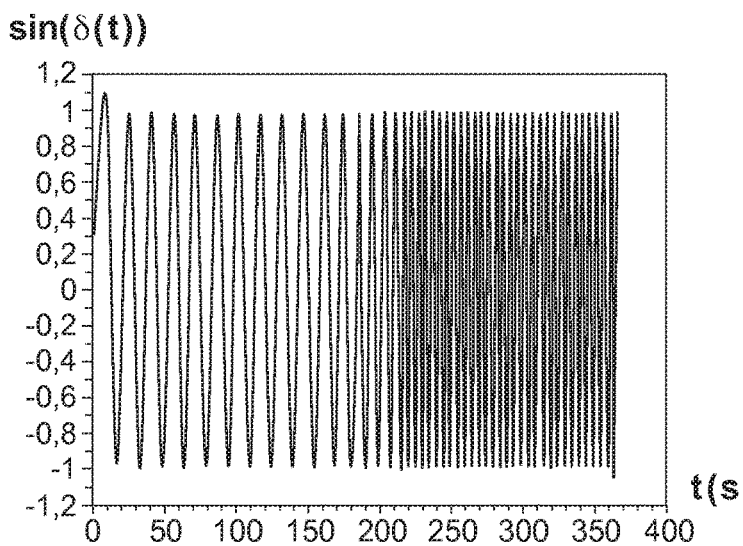
Figure 10:
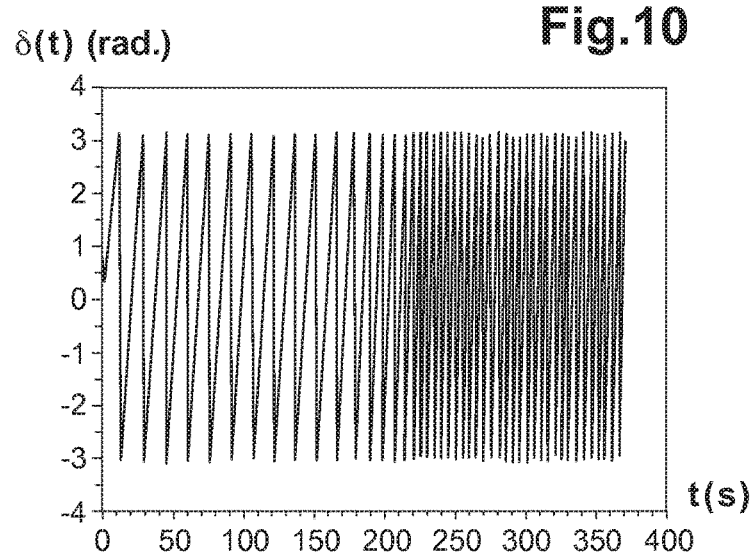
Figure 11:
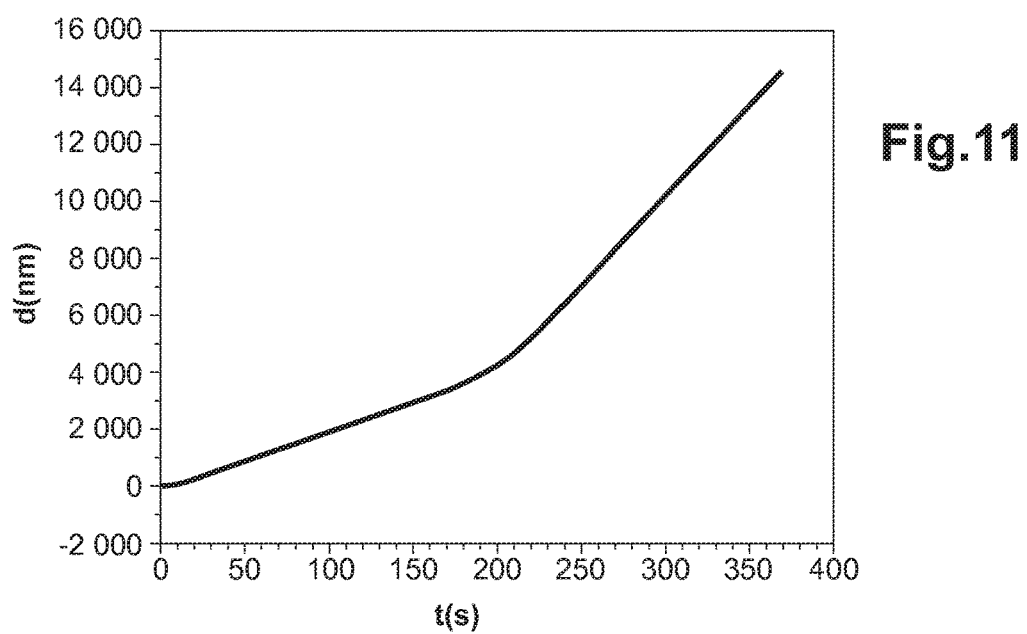
Figure 12:
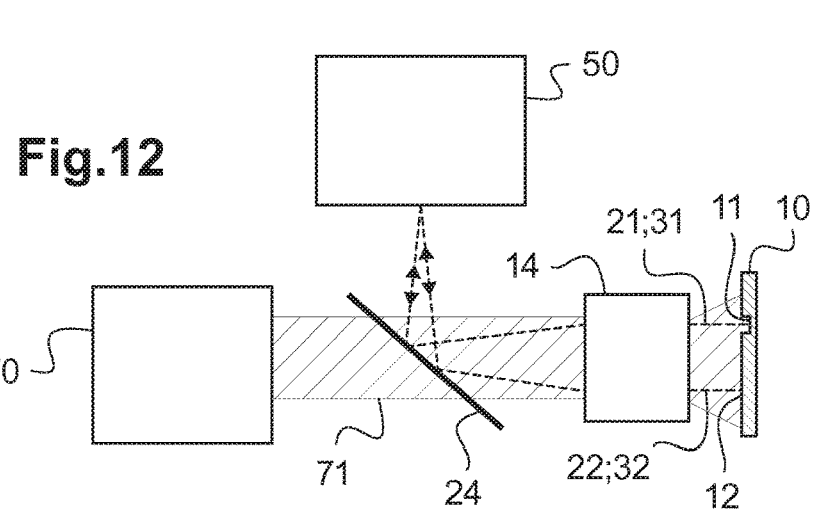

FIG. 4, respectively FIG. 5, show an acquisition of interferometric intensity along the linear polarisation L, respectively circular polarisation C, as a function of time;

FIG. 6 illustrates a step of determining the local minima and maxima on a curve of polarised interferometric intensity;

FIG. 7 illustrates a step of calculating an envelope of the curve of polarised interferometric intensity, by interpolation of the minima, and respectively maxima, determined on FIG. 4;

FIG. 8, respectively FIG. 9, shows the interferometric intensity measurements along the linear, and respectively circular, polarisation after local normalisation;

FIG. 10 shows an optical phase-shift measurement calculated from the curves of intensity with local normalisation of FIGS. 8 and 9;

FIG. 11 shows an etch depth measurement calculated from the curves of intensity with local normalisation of FIGS. 7 and 8;

FIG. 12 schematically shows an example of a polarimetric camera device.

The present disclosure relates in particular to a method and a system for processing differential polarimetric interferometry data acquired during the etching of a sample, in a reactor of in a glow discharge plasma source.

Figure 1:
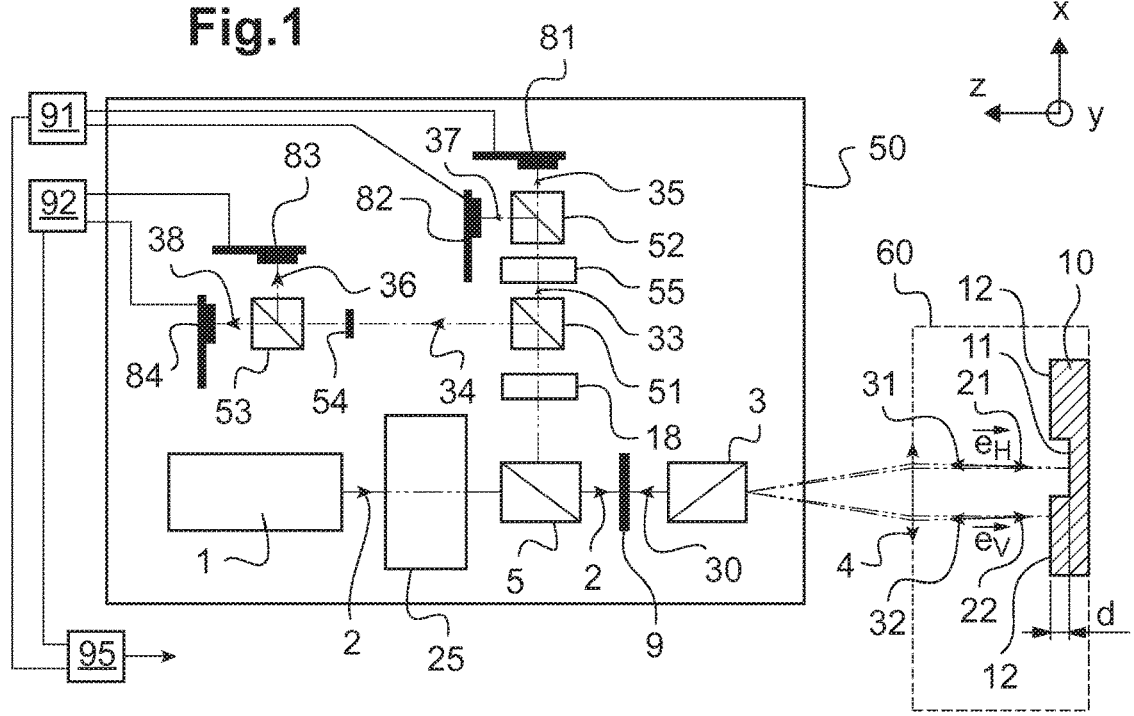

In FIG. 1 is schematically shown an apparatus 60 for selective etching of a sample. This apparatus may be a reactor for vapour-phase chemical etching or a reactor for plasma-assisted etching. In a particular application, the apparatus 60 is a discharge lamp for a glow discharge spectrometer.

A sample 10 is placed in the selective etching apparatus so that a first area 11 is exposed to the selective etching treatment whereas a second area 12 of the sample is protected or masked from the etching treatment. This selective etching may result from a configuration of the etching treatment that is spatially localized on the first area 11. As an alternative, the apparatus includes a mask or a screen adapted to selectively protect the second area 12 from the etching treatment while exposing the first area 11 to the etching treatment. According to another alternative, the second area 12 of the sample includes a masking layer deposited on the surface of the sample, this mask layer having a negligible etching speed with respect to the etching speed of the first area 11 when the sample is exposed to the etching treatment.

In the example illustrated in FIG. 1, the sample includes a planar face arranged in a plane XY of an orthonormal reference system (X, Y, Z). The normal to the plane of the sample is parallel to axis Z. It is supposed that the etching treatment generates a flat bottom erosion crater on the first area 11 of the sample 10.

Let's note d(t) the etch depth as a function of time, i.e. the distance between the first area 11 and the second area along axis Z. It is desired to measure accurately the etch depth d(t) as a function of the time of exposure to the etching treatment.

For that purpose, the selective etching apparatus 60 is combined with an in situ etch depth measurement instrument. A polarimetric interferometry system comprising a polarimetric detection system configured to detect simultaneously four independent polarisation components of the interferometric beam, preferably two orthogonal linear polarisation components and two orthogonal circular polarisation components, is preferably used.

The polarimetric interferometry system essentially includes a light source 1, an optical beam splitter 3 that splits the source beam into two incident beams propagating along two separated optical paths, an optical beam combiner that recombines the two beams after reflection on two distinct areas of the sample, a source-detector splitter 5, a polarimetric detection system and a signal processing system.

More precisely, the etch depth measurement instrument of FIG. 1 comprises a light source 1, that is for example a laser source or a laser diode. The light source 1 emits a source beam 2, preferably monochromatic, for example at a wavelength of 635 nm, or of 780 nm, 532 nm, 405 nm. Advantageously, an optical isolator 25 is placed on the source beam 2. A source-detector splitter 5, for example of the splitting plate type (50-50) or non-polarising splitting cube, is arranged on the source beam 2. A half-wave plate 9 allows orienting the polarisation axis of the source beam. The source-detector splitter 5 directs the source beam 2 towards a half-wave plate 9, then towards another beam splitter 3.

The beam splitter 3 is for example a polarisation splitter cube, whose polarisation axes are inclined by 45 degrees with respect to the axis of the linearly polarized incident beam 2 that has passed through the half-wave plate 9. By way of example, the beam splitter 3 is a Wollaston prism that is adapted to angularly split the incident beam into a first incident beam 21 and a second incident beam 22. Advantageously, the first incident beam 21 and the second incident beam 22 are linearly polarized along polarisation states that are orthogonal to each other. Hence, the first incident beam 21, which is p-polarised, is directed in a first direction, and the second incident beam 22, which is s-polarised, is directed in a second direction. By construction of the Wollaston prism 3, the first direction and the second direction are angularly separated by an angle comprised between 0.1 and 20 degrees.

Advantageously, the half-wave plate 9 is oriented so that the first incident beam 21 and the second incident beam 22 have the same amplitude.

A lens 4 is mounted on an aperture providing an optical access inside the treatment reactor. Preferably, the beam splitter 3 is arranged at the focal point of the lens 4. Hence, the lens 4 forms two spatially separated incident beams 21, 22 that propagate parallel to each other in the selective etching treatment reactor, towards a face of the sample. That way, the lens 4 focuses the first incident beam 21 on the first area 11 of the sample, which is exposed to the etching plasma. On the other hand, the lens 4 focuses the second incident beam 22 to the second area 12 of the sample, which is protected from the etching plasma. The angle of incidence on the first area and on the second area is generally lower than 10 degrees, and preferably lower than or equal to 5 degrees. By reflection on the first area 11, the first incident beam 21 forms a first reflected beam 31. Similarly, by reflection on the second area 12, the second incident beam 22 forms a second reflected beam 32.

In a variant, instead of the Wollaston prism 3, a beam offset splitter may be used and the lens 4 may be replaced by a window.

According to an alternative embodiment, a non-null incidence angle with respect to the normal on the sample is used to angularly separate the first reflected beam 31 and the second reflected beam 32 with respect to the first incident beam 21 and the second incident beam 22. That way, the recombined reflected beam 30 is spatially separated from the incident beam 2, without requiring a source-detector splitter.

In the example illustrated in FIG. 1, the sample has a planar face and the etching of the first area 11 generates a flat bottom crater. Preferably, as illustrated in this example, the incident beams 21, 22 are reflected on the sample with a null incidence angle. In this case, the first reflected beam 31 propagates in the opposite direction with respect to the first incident beam 21, and, respectively, the second reflected beam 32 propagates in the opposite direction with respect to the first incident beam 22.

The lens 4 collects the first reflected beam 31 and the second reflected beam 32 and directs them towards an optical recombination system, which is herein the same Wollaston prism 3 having served to split the incident beam.

The Wollaston prism 3 recombines the first reflected beam 31 and the second reflected beam 32 to form an interferometric beam 30. The interferometric beam 30 passes through the half-wave plate 9 and is incident on the non-polarising source-detector splitter 5 that reflects it towards a polarimetric detection system.

The filter 18 is a spectral filter, preferably centred on the wavelength of emission of the light source 1. The filter 18 advantageously allows eliminating the spurious light coming from the plasma or from the ambient lighting. The filter 18 is for example an interferential filter centred on 635 nm, of spectral width 10 nm.

The polarimetric detection system includes a non-polarising splitter 51, a first polarisation splitter 52 and a second polarisation splitter 53, a quarter-wave plate 54, a polarisation rotator 55 and four detectors 81, 82, 83, 84. In an alternative embodiment, the positions of the elements 54 and 55 may be inverted.

Advantageously, the non-polarising splitter 51 preserves at best the polarisation state of the incident interferometric beam on both the transmitted and reflected paths. As such, the non-polarising splitters for laser, optimised for a narrow wavelength range are preferable to the wide-band splitters, covering for example the overall visible range. The non-polarising splitter 51 receives the interferometric beam 30 and splits it to form a first fraction of interferometric beam 33 on the transmission path of the non-polarising splitter 51 and, respectively, a second fraction of interferometric beam 34 on the reflection path of the non-polarising splitter 51.

The polarisation rotator 55 is associated with the polarisation splitter 52 to form an analyser of linear polarisations oriented at 45 degrees with respect to the axes of the beam splitter 3. The detector 81 detects a linear polarisation component 35 of the first fraction of interferometric beam 33, this linear polarisation component 35 being oriented at +45 degrees with respect to the axes of the beam splitter 3. Simultaneously, the detector 82 detects another linear polarisation component 37 of the first fraction of interferometric beam 33, this other linear polarisation component 37 being oriented at −45 degrees with respect to the axes of the beam splitter 3.

The quarter-wave plate 54 is associated with the polarisation splitter 53 to form an analyser of respectively right and left circular polarisations. The detector 83 detects the right circular polarisation component 36 of the second fraction of interferometric beam 34. Simultaneously, the detector 84 detects the left circular polarisation component 38 of the second fraction of interferometric beam 34.

Hence, the polarimetric detection system of FIG. 1 allows detecting simultaneously the four independent polarisation components of the interferometric beam 30.

From the fours signals detected by the four detectors 81, 82, 83, 84, it is possible to deduce therefrom the phase-shift between the beam 31 reflected by the first area 11, i.e. the crater resulting from the etching of the sample, and the beam 32 reflected by the second area 12, which serves as reference.

Particularly advantageously, the polarimetric detection system is configured to detect simultaneously at least two, and preferably four, orthogonal polarisation components of the interferometric beam, i.e. at least two orthogonal linear polarisation components and/or two orthogonal circular polarisation components.

First will be described in detail the conventional approach of analysis of the signals corresponding to the four polarisation components.

Let's note:

$I_{L1}$ the intensity of the linear component of the interferometric beam along a direction at +45 degrees with respect to the horizontal linear polarisation (H) of the incident beam on the first area and with respect to the vertical linear polarisation (V) of the incident beam on the second area;

$I_{L2}$ the intensity of the linear component of the interferometric beam along a direction at −45 degrees with respect to the linear polarisation H of the incident beam on the first area and with respect to the linear polarisation V of the incident field on the second area;

$I_{C1}$ the intensity of the right circular component of the interferometric beam, and $I_{C2}$ the intensity of the left circular component of the interferometric beam.

During the etching of the sample, the depth of the first area increases and hence the phase difference between the two reflected waves varies as a function time t.

More precisely, let's note $\delta(t)$ the relative optical phase-shift between the first reflected beam and the second reflected beam:

$$\delta(t) = 2kd(t) + \varphi_H + \varphi_V$$

where $k = 2\pi/\lambda$ and $d(t)$ represent the etch depth as a function of time.

The reflection coefficient on the first area, $r_V$, and the reflection coefficient on the second area, $r_H$, are expressed by the following formulas:

$$r_V = \rho_V \exp(i\varphi_V)$$

$$r_H = \rho_H \exp(i\varphi_H)$$

In polarimetric interferometry, on the one hand, the normalised intensity difference L between the intensities detected on the linear polarisation paths are conventionally calculated:

$$L = \frac{I_{L1} - I_{L2}}{I_{L1} + I_{L2}} = \frac{2 E_V E_H \rho_V \rho_H \cos(\delta(t))}{E_V^2 \rho_V^2 + E_H^2 \rho_H^2}$$

On the other hand, the normalised intensity difference C between the intensities detected on the circular polarisation paths are conventionally calculated:

$$C = \frac{I_{C1} - I_{C2}}{I_{C1} + I_{C2}} = \frac{2 E_V E_H \rho_V \rho_H \sin(\delta(t))}{E_V^2 \rho_V^2 + E_H^2 \rho_H^2}$$

Theoretically, it is shown that the relative phase-shift $\delta(t)$ between the two reflected optical beams is written:

$$\delta(t) = \tan^{-1}\left(\frac{I_{C1} - I_{C2}}{I_{C1} + I_{C2}} \cdot \frac{I_{L1} + I_{L2}}{I_{L1} - I_{L2}}\right)$$

Formulated differently:

$$\delta(t) = \tan^{-1}\left(\frac{C}{L}\right)$$

It is deduced from this phase-shift the relative depth difference $d(t)$ between the two areas on which are directed the two incident beams.

In practice, the polarimetric detection may be affected by defects due to the optical components, mirrors, beam splitter and/or combiner. Moreover, the polarimetric signals may also be affected by modifications of the properties of the sample itself as a function of the etching time. The evolution of the state of surface and/or of the roughness may modify the polarimetric signals.

A so-called global normalisation method exists to correct certain undesirable effects.

In the case of an ideal polarimetric detection, and of an imperfect recombination of the beams and the mirrors, the polarimetric intensity signals respectively received on the four detectors 81, 82, 83, 84 can be respectively written as:

$$I_{L_1} = a_{L_1} + b_{L_1} \cdot \cos\delta(t)$$

$$I_{L_2} = a_{L_2} - b_{L_2} \cdot \cos\delta(t)$$

$$I_{C_1} = a_{C_1} + b_{C_1} \cdot \sin\delta(t)$$

$$I_{C_2} = a_{C_2} + b_{C_2} \cdot \sin\delta(t)$$

where the coefficient a represents an offset parameter and, respectively, the coefficient b represents an amplitude parameter.

Using a sampling period in which only $\delta(t)$ varies, for example on a reference substrate, parameters such as offset a and amplitude b can be calculated for each polarimetric intensity:

$$a = \frac{\max(I) + \min(I)}{2}$$

$$b = \frac{\max(I) - \min(I)}{2}$$

A globally normalised intensity $\tilde{I}$ is hence calculated:

$$\tilde{I} = \frac{I-a}{b}$$

δ(t) is deduced by the following equation:

$$\tan\delta(t) = \frac{\widetilde{I_{C2}} - \widetilde{I_{C1}}}{\widetilde{I_H} - \widetilde{I_V}}$$

This global normalisation is satisfying in certain situations, but suffers from drawbacks. Firstly, the user must define a time area of normalisation after the data acquisition. Hence, this normalisation is incompatible with a real-time estimation. Experience shows that, for a given sample, a single set of normalisation coefficients cannot be used for several measurements. Moreover, this global normalisation supposes the unicity of the normalisation coefficients for a given measurement, whereas experience shows that certain samples have a surface roughness that evolves during the measurement, which affects the results.

Figure 2:
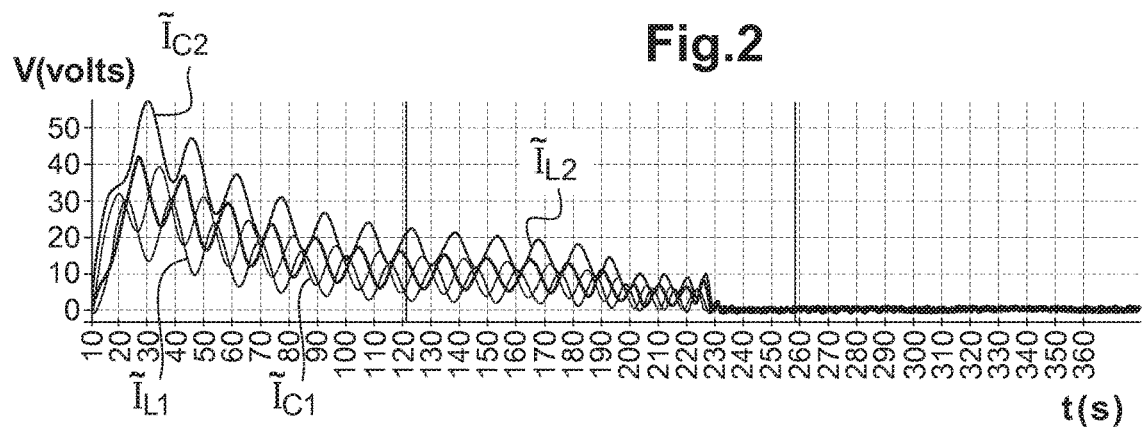
FIG. 2 shows curves of intensity as a function of time obtained from polarimetric interferometry measurements and a global normalisation treatment.

FIG. 2 illustrates an example of measurement normalised according to the global normalisation technique. The sample is formed of a layer of titanium nitride having a thickness of about 4 microns on a substrate of tungsten carbide. The curves are recorded during the etching of the sample. The normalisation is performed over a time section of the curve (corresponding to t>220 s in the shown example). Then, an extrapolation is performed by applying the same coefficients on the remainder of the curve (t<220 s). The globally normalised curved $\widetilde{I_{C1}}$, $\widetilde{I_{C2}}$, $\widetilde{I_{L_1}}$, and $\widetilde{I_{L_2}}$ as a function of time t over a time interval extending from 0 to 360s have respectively been represented. The etching treatment starts at the time instant t=0. In the section of the curves where t is higher than about 220 s, the curves oscillate between the values +1 and −1. A correct global normalisation is hence observed over the section of the intensity curves corresponding to t>220 s. On the other hand, the global normalisation appears clearly unsuited over the first section of the curves, for t<220 s.

Figure 3:
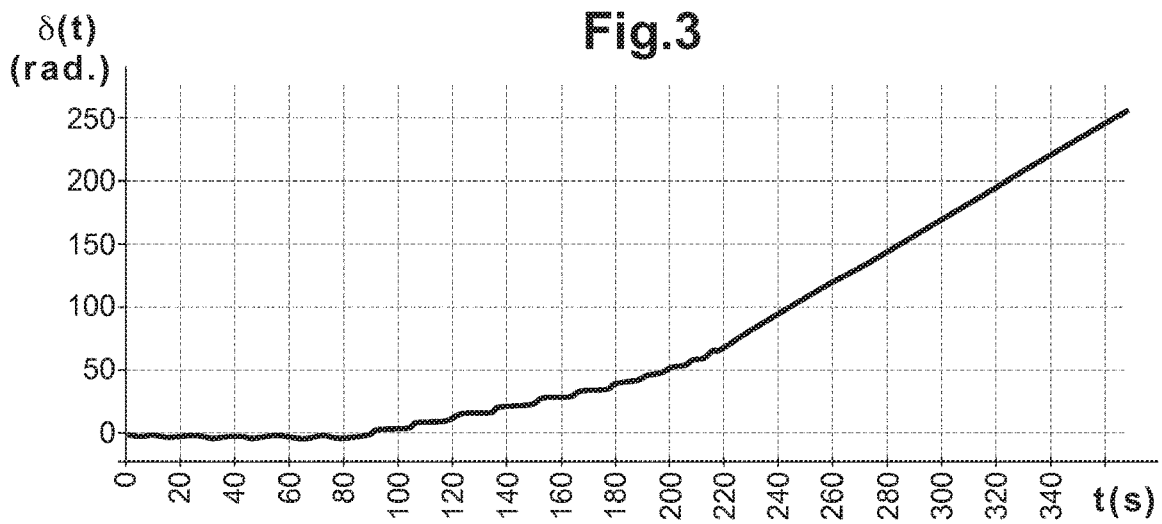
FIG. 3 shows an optical phase-shift measurement calculated from curves of intensity with global normalisation of FIG. 2.

FIG. 3 illustrates the time phase-shift calculated from these globally normalised intensity curves as shown in FIG. 2. The time phase-shift δ(t) seems to vary monotonously with a reduced noise in the section in which t>220 s. On the other hand, for t<220 s, phase hopping and an evolution of the phase different from the expected linear evolution are observed. Indeed, during the first section up to t~100 s, the phase-shift oscillates about a null mean value, which leads to an important error of evaluation of the etch depth.

An innovative approach of analysis of polarimetric interferometry signals will now be detailed.

As detailed hereinabove, the polarimetric detection system with four detectors illustrated in FIG. 1 allows detecting simultaneously two interferometric signals of orthogonal linear polarisations $I_{L1}$ and $I_{L2}$ and/or two interferometric signals of orthogonal circular polarisations $I_{C1}$ and $I_{C2}$. By way of example, the signal $I_{L1}$ represents a horizontal polarisation, respectively the signal $I_{L2}$ represents a vertical polarisation, the signal $I_{C1}$ represents a right circular polarisation and the signal $I_{C2}$ represents a left circular polarisation.

In FIG. 1, the polarimetric detection system is connected to different calculation modules 91, 92, 95 belonging to a computing processor.

The computing module 91 uses a first ratio of linear combinations of the intensities of two interferometric signals detected on the orthogonal linear polarisation paths, $I_{L1}$ and $I_{L2}$, to form a first normalised intensity difference L at each time instant t:

$$L = \frac{I_{L1} - I_{L2}}{I_{L1} + I_{L2}}$$

Hence, the computing module 91 may provide in real time, or in post-processing, the value of L(t) at each time instant t.

Particularly advantageously, the computing module 92 uses a second ratio of linear combinations of the intensities of the two other interferometric signals detected on the orthogonal circular polarisation paths, $I_{C1}$ and $I_{C2}$, to form a second normalised intensity difference C at each time instant t:

$$C = \frac{I_{C1} - I_{C2}}{I_{C1} + I_{C2}}$$

Hence, the computing module 92 may provide in real time, or in post-processing, the value of C(t) at each time instant t.

The first normalised intensity difference L is a function of cos(δ(t)) and, respectively, the second normalised intensity difference C is a function of sin(δ(t)):

$$L \approx \alpha_L(t) + \beta_L(t)\cos\delta(t)$$

$$C \approx \alpha_C(t) + \beta_C(t)\sin\delta(t)$$

The purpose is to calculate cos(δ(t)) and sin(δ(t)) from these measurements.

A non-transparent sample, for which the phase variations are proportional to the etch depth variations, in considered herein.

In FIG. 4 is shown a record of the first normalised intensity difference L as a function of time t over the time interval (0; 360s) for the sample described hereinabove. Likewise, in FIG. 5 is shown a record of the normalised intensity difference C as a function of time t over the time interval (0; 360s) for the same sample.

It can be observed that the signal envelope variations, defined by the variables $\alpha_{L,C}$ and $\beta_{L,C}$ are slow inside each layer of material, with sometimes steep variations at the interface between two layers. However, the envelope of the signals has generally an oscillation-free behaviour.

The processing of the data then includes the following steps.

Step 1:

For each curve of normalised intensity difference as a function of time t, the local minima and maxima are determined. In other words, the top and bottom are found at each oscillation.

Hence, in FIG. 6 are shown small circles 100 corresponding to the local minima and, respectively, small circles 200 corresponding to the local maxima, on the curve of the first normalised intensity difference L.

In a variant of this step, a filtering is previously performed, for example by sampling and/or calculation of a mean, in order to reduce the noise.

According to a particular aspect, the computing module 91, respectively 92, eliminates the false minima and false maxima. For example, it is verified that a minimum or a maximum of L is positioned in the middle of the time interval between a minimum and a maximum of C, and vice versa.

Step 2:

An upper envelope curve UL is determined by interpolation between the local maxima 200 of the first normalised intensity difference L. Similarly, a lower envelope curve LL is determined by interpolation between the local minima 100 of the first normalised intensity difference L. The interpolation may be linear or based on a spline function or a polynomial decomposition.

The computing module 91 is advantageously configured to calculate the lower envelope UL(t) and upper envelope LL(t) curves at each time instant t or in a predetermined sampling period.

Particularly advantageously, another upper envelope curve UC is similarly determined by interpolation between the local maxima of the second normalised intensity difference C and, respectively, another lower envelope curve LC by interpolation between the local minima of the second normalised intensity difference C.

Similarly, the computing module 92 is configured to calculate the lower envelope UC(t) and upper envelope LC(t) curves at each time instant t or in the predetermined sampling period.

Step 3:

Another computing module 95 receives the envelope curves UL(t), LL(t), UL(t) and LL(t). The computing module 95 calculates a first offset function at each time instant t:

$$\alpha_L(t) = \frac{UL(t) + LL(t)}{2}$$

The computing module 95 calculates a first normalisation function at each time instant t:

$$\beta_L(t) = \frac{UL(t) - LL(t)}{2}$$

Advantageously, the computing module 95 calculates a second offset function at each time instant t:

$$\alpha_C(t) = \frac{UC(t) + LC(t)}{2}$$

The computing module 95 calculates a second normalisation function at each time instant t:

$$\beta_C(t) = \frac{UC(t) - LC(t)}{2}$$

The computing module 95 applies the first offset function $\alpha_L(t)$ and the first normalisation function $\beta_L(t)$ to the first differential polarimetric interferometry signal, to calculate a first normalised differential polarimetric interferometry function and to deduce therefrom:

$$\cos(\delta(t)) \approx \frac{L(t) - \alpha_L(t)}{\beta_L(t)}$$

FIG. 8 hence shows the first normalised differential polarimetric interferometry function equal to $\cos(\delta(t))$ as a function of time t.

Similarly, the second offset function $\alpha_C(t)$ and the normalisation function $\beta_C(t)$ are applied to the second polarimetric interferometry signal, to calculate a second normalised differential polarimetric interferometry function and to deduce therefrom:

$$\sin(\delta(t)) \approx \frac{C(t) - \alpha_C(t)}{\beta_C(t)}$$

FIG. 9 hence shows the second normalised differential polarimetric interferometry function equal to $\sin(\delta(t))$ as a function of time t.

It can be observed that the local normalisation is almost perfect over the whole time interval (0; 360s) in FIGS. 8 and 9, the curves oscillating between the values of −1 and +1 over the whole time interval, despite the change of interface at about 220 s.

Step 4:

The computing module 95 extracts the instantaneous phase-shift $\delta(t)$, for example by calculating the arc tangent function of the ratio between the second normalised differential polarimetric interferometry function, $\sin(\delta(t))$, and the first normalised differential polarimetric interferometry function, $\cos(\delta(t))$.

FIG. 10 hence shows the phase-shift in radians, as a function of time, modulo π. An algorithm allows unfolding the phase-shift as a function of time. In the air or in vacuum, the refractive index of the etch crater is equal to 1. A conversion factor of 50,5 nm/rad. allows deducing therefrom the etch depth d(t) as a function of time, as illustrated in FIG. 11.

By comparing the shape of FIG. 3 with that of FIG. 11, it can be observed that the errors due to the global normalisation have disappeared.

The method allows an automatic local normalisation of the differential polarimetric interferometry signals. It is not necessary to perform a previous calibration.

The user does not intervene manually to define the time interval of normalisation.

Moreover, it is not necessary to record calibration coefficients.

In an embodiment, the calculations are performed a posteriori.

In a variant, the calculations are performed in real time, with adjustment as the acquisition of new measurements goes along.

The invention finds a particular application in a glow discharge spectrometry apparatus, where the sample is exposed to a plasma selective etching treatment. The etch depth measurement instrument allows a more accurate and more reliable measurement of the etch depth in the sample.

The invention also finds a particular application in a polarimetric camera device, illustrated by way of example in FIG. 12. The polarimetric camera device includes a differential polarimetric interferometer 50 as described in the present disclosure and an imaging system 70. The imaging system includes a visualisation camera and, preferably, a lighting light source. The polarimetric camera device further includes a splitting plate 24 and an optical system 14 based on lens(es) or mirror(s). The splitting plate 24 is for example a dichroic plate that allows combining the optical paths of the differential polarimetric interferometer 50 and of the imaging system 70. The splitting plate 24 combined to the optical system 14 directs the first incident beam 21 towards a first area 11 of the sample and, respectively, the second incident beam 22 towards a second area 12 of the sample. In the return direction, the optical system 14 combined to the splitting plate 24 sends back the first reflected beam 31 and the second reflected beam 32 towards the detection system of the differential polarimetric interferometer 50.

Simultaneously, the optical system 14 combined to the splitting plate 24 transmits a light beam 71 towards the visualisation camera of the imaging system 70. The light beam 71 is formed by reflection on an extended surface of the sample preferably comprising the first area 11 and the second area 12. The visualisation camera hence forms the image of the surface of the sample 10.

The polarimetric camera device hence allows measuring accurately the etch depth between the first area 11 and the second area 12 of the sample, while providing an image of an extended surface of the sample.

The invention claimed is:

1. A method for measuring etch depth as a function of time by differential polarimetric interferometry, comprising the following steps:
   splitting a light beam (2) into a first incident beam (21) and a second incident beam (22), the first incident beam (21) being directed towards a first area (11) of a sample (10) exposed to an etching treatment to form a first reflected beam (31) and, respectively, the second incident beam (22) being directed towards a second area (12) of the sample to form a second reflected beam (32),
   recombining the first reflected beam (31) and the second reflected beam (32) to form an interferometric beam,
   polarisation splitting the interferometric beam into at least a first polarisation component (35) and a second polarisation component (37), orthogonal to each other;
   detecting, as a function of time (t), over a time interval (t0, t1), a first interferometric intensity signal relating to the first polarisation component (35) and a second interferometric intensity signal relating to the second polarisation component (37);
   calculating a first differential polarimetric interferometry signal as a function of linear combinations of the first interferometric intensity signal and of the second interferometric intensity signal;
   calculating a first lower envelope function and a first upper envelope function of the first differential polarimetric interferometric signal over the time interval (t0, t1);
   determining a first offset function equal to half a sum of the first lower envelope function and the first upper envelope function at each time instant (t) of the time interval (t0, t1);
   determining a first normalisation function equal to half a difference between the first lower envelope function and the first upper envelope function at each time instant (t) of the time interval (t0, t1);
   applying the first offset function and the first normalisation function to the first differential polarimetric interferometry signal to form a first locally-normalised differential polarimetric interferometry function at each time instant (t) of the time interval (t0, t1); and
   extracting an optical phase-shift measurement as a function of time over said time interval (t0, t1), from the first locally-normalised differential polarimetric interferometry function;
   calculating the etch depth as a function of time from the optical phase-shift measurement.

2. The method according to claim 1, wherein the step of polarisation splitting the interferometric beam further generates a third polarisation component (36) and a fourth polarisation component (38), said third and fourth polarisation components being orthogonal to each other, and the first, second, third and fourth polarisation components being independent of each other, and the method further comprising the following steps:
   detecting, as a function of time (t), on the time interval (t0, t1), a third interferometric intensity signal relating to the third polarisation component and a fourth interferometric intensity signal relating to the fourth polarisation component;
   calculating a second differential polarimetric interferometry signal as a function of linear combinations of the third interferometric intensity signal and of the fourth interferometric intensity signal;
   calculating a second lower envelope function and a second upper envelope function of the second differential polarimetric interferometry signal;
   determining a second offset function equal to half a sum of the second lower envelope function and the second upper envelope function at time instant t;
   determining a second normalisation function equal to half a difference between the second lower envelope function and the second upper envelope function at time instant t;
   applying the second offset function and the second normalisation function to the second differential polarimetric interferometry signal to form a second locally-normalised differential polarimetric interferometry function, and wherein
   the extraction of the optical phase-shift measurement as a function of time over said time interval (t0, t1) is performed from a ratio between the first locally-normalised differential polarimetric interferometry function and the second locally-normalised differential polarimetric interferometry function.

3. The method according to claim 2, wherein the third polarisation component and the fourth polarisation component are chosen among linear, or respectively circular, polarisation components.

4. The method according to claim 3, wherein the second differential polarimetric interferometry signal is equal to a difference between the third interferometric intensity signal and the fourth interferometric intensity signal divided by a sum of the third interferometric intensity signal and the fourth interferometric intensity signal.

5. The method according to claim 2, wherein the second differential polarimetric interferometry signal is equal to a difference between the third interferometric intensity signal and the fourth interferometric intensity signal divided by a sum of the third interferometric intensity signal and the fourth interferometric intensity signal.

6. The method according to claim 1, wherein the first polarisation component and the second polarisation component are chosen among linear, or respectively circular, polarisation components.

7. The method according to claim 6, wherein the first polarisation component and the second polarisation component are chosen among linear, or respectively circular, polarisation components.

8. The method according to claim 1, wherein the first differential polarimetric interferometry signal is equal to a difference between the first interferometric intensity signal and the second interferometric intensity signal divided by a sum of the first interferometric intensity signal and the second interferometric intensity signal.

9. The method according to claim 1, wherein the step of calculating a first, and/or respectively second, lower envelope function includes a step of linear or polynomial interpolation and/or the step of calculating a first, and/or respectively second, upper envelope function includes another step of linear or polynomial interpolation.

10. The method according to claim 1, further comprising a step of filtering the first interferometric intensity signal and/or, respectively, the second interferometric intensity signal, before the step of envelope function calculation.

11. A differential polarimetric interferometer comprising:
a light source (1) adapted to generate a light beam (2);
an optical beam splitter (3) adapted to split the light beam (2) into a first incident beam (21) and a second incident beam (22), the first incident beam (21) being directed towards a first area (11) of a sample exposed to an etching treatment to form a first reflected beam (31) and, respectively, the second incident beam (22) being directed towards a second area (12) of the sample to form a second reflected beam (32);
a beam combiner (3) adapted to recombine the first reflected beam (31) and the second reflected beam (32) to form an interferometric beam;
a polarisation splitter (52) adapted to split the interferometric beam into at least a first polarisation component (35) and a second polarisation component (37), the first polarisation component and the second polarisation component being orthogonal to each other;
a first detector (81) adapted to receive the first polarisation component (35) and to generate a first interferometric intensity signal as a function of time (t) over a time interval (t0, t1) and a second detector (82) adapted to receive the second polarisation component (37) and to generate a second interferometric intensity signal as a function of time (t) over a time interval (t0, t1);
wherein the differential polarimetric interferometer includes a calculator (91, 92, 95) adapted to:
calculate a first differential polarimetric interferometry signal as a function of linear combinations of the first interferometric intensity signal and of the second interferometric intensity signal,
calculate a first lower envelope function and a first upper envelope function of the first differential polarimetric interferometry signal over the time interval (t0, t1),
determine a first offset function equal, at each time instant t, to half a sum of the first lower envelope function and the first upper envelope function,
determine a first normalisation function equal, at each time instant t of the time interval (t0, t1), to half a difference between the first lower envelope function and the first upper envelope function,
apply the first offset function and the first normalisation function to the first differential polarimetric interferometry signal to form a first locally-normalised differential polarimetric interferometry function, and
extract an optical phase-shift measurement as a function of time over said time interval (t0, t1), from the first locally-normalised differential polarimetric interferometry function, and
calculate the etch depth as a function of the optical phase-shift.

12. The differential polarimetric interferometer according to claim 11, further comprising:
another polarisation splitter (53) adapted to split the interferometric beam into a third polarisation component (36) and a fourth polarisation component (38), the third polarisation component (36) and the fourth polarisation component (38) being orthogonal to each other and being independent of the first polarisation component (35) and of the second polarisation component (37);
a third detector (83) adapted to receive the third polarisation component (36) and to generate a third interferometric intensity signal as a function of time (t) over the time interval (t0, t1) and a fourth detector (84) adapted to receive the fourth polarisation component (38) and to generate a fourth interferometric intensity signal as a function of time (t) over the time interval (t0, t1);
and wherein the calculator is adapted to:
calculate a second differential polarimetric interferometry signal as a function of linear combinations of the third interferometric intensity signal and of the fourth interferometric intensity signal;
calculate a second lower envelope function and a second upper envelope function of the second differential polarimetric interferometry signal over the time interval (t0, t1);
determine a second offset function equal, at each time instant t, to half a sum of the second lower envelope function and the second upper envelope function;
determine a second normalisation function equal, at each time instant t of the time interval (t0, t1), to half a difference between the second lower envelope function and the second upper envelope function;
apply the second offset function and the second normalisation function to the second differential polarimetric interferometry signal to form a second locally-normalised differential polarimetric interferometry function; and
perform the extraction of the optical phase-shift measurement as a function of time over said time interval (t0, t1), from a ratio between the first locally-normalised differential polarimetric interferometry function and the second locally-normalised differential polarimetric interferometry function.

13. An etching control device comprising a differential polarimetric interferometer according to claim 12, combined with a visualisation camera adapted to form an image of the first area and of the second area of the sample.

14. A glow discharge spectrometry apparatus comprising a differential polarimetric interferometer according to claim 12.

15. A glow discharge spectrometry apparatus comprising a differential polarimetric interferometer according to claim 11.

16. An etching control device comprising a differential polarimetric interferometer according to claim 11, combined with a visualisation camera adapted to form an image of the first area and of the second area of the sample.

* * * * *